(12) United States Patent
Kaneda et al.

(10) Patent No.: US 8,153,476 B2
(45) Date of Patent: Apr. 10, 2012

(54) ELECTRONIC COMPONENT AND METHOD OF MANUFACTURING THE SAME

(75) Inventors: Yasufumi Kaneda, Yokohama (JP); Akira Moriya, Yokohama (JP); Kaoru Sakinada, Yokohama (JP); Shunichi Aikawa, Yokohama (JP); Yoshinori Kondou, Yokohama (JP); Takashi Yamashita, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/040,793

(22) Filed: Mar. 4, 2011

(65) Prior Publication Data

US 2011/0156265 A1 Jun. 30, 2011

Related U.S. Application Data

(62) Division of application No. 12/388,215, filed on Feb. 18, 2009, now abandoned.

(30) Foreign Application Priority Data

Feb. 26, 2008 (JP) .................................. 2008-44818

(51) Int. Cl.
*H01L 21/44* (2006.01)
*H01L 21/30* (2006.01)
(52) U.S. Cl. .......... 438/113; 438/50; 438/458; 438/462; 257/E21.596
(58) Field of Classification Search .................... 438/50, 438/113, 458, 462; 257/E21.596
See application file for complete search history.

(56) References Cited

U.S. PATENT DOCUMENTS

| | | | |
|---|---|---|---|
| 5,438,305 A | 8/1995 | Hikita et al. | |
| 7,607,586 B2 | 10/2009 | Wang | |
| 2002/0015958 A1 | 2/2002 | Audeh et al. | |
| 2002/0097962 A1 | 7/2002 | Yoshimura et al. | |
| 2003/0080422 A1* | 5/2003 | Ohara | 257/738 |
| 2004/0090299 A1* | 5/2004 | Gijs | 336/200 |
| 2004/0157410 A1* | 8/2004 | Yamaguchi | 438/460 |
| 2005/0098433 A1* | 5/2005 | Gundel | 204/403.02 |
| 2006/0079024 A1* | 4/2006 | Akram | 438/110 |
| 2006/0214798 A1 | 9/2006 | Wang | |
| 2007/0075606 A1 | 4/2007 | Inoue et al. | |
| 2009/0212399 A1 | 8/2009 | Kaneda et al. | |

FOREIGN PATENT DOCUMENTS

| | | |
|---|---|---|
| CN | 2720623 Y | 8/2005 |
| JP | 63-269549 | 11/1988 |
| JP | 07-221101 | 8/1995 |
| JP | 09-055398 A | 2/1997 |
| JP | 11-040925 A | 2/1999 |
| JP | 2002-289988 A | 10/2002 |
| JP | 2002-299517 | 10/2002 |

(Continued)

OTHER PUBLICATIONS

U.S. Appl. No. 12/388,215, filed Feb. 18, 2009.

(Continued)

*Primary Examiner* — Nitin Parekh
(74) *Attorney, Agent, or Firm* — Chen Yoshimura LLP

(57) ABSTRACT

An electronic component includes a substrate, a functional element formed on the substrate, a plurality of terminals including a first terminal electrode connected to the functional element and a second terminal electrode layered on the first terminal electrode, and a feed line, one end of which is electrically connected to the first terminal electrode and the other end of which reaches an edge of the substrate, wherein the feed line includes a first portion directly reaching the edge, and a second portion branching from the first portion and then reaching the edge.

7 Claims, 20 Drawing Sheets

FOREIGN PATENT DOCUMENTS

| | | |
|---|---|---|
| JP | 2003-188669 | 7/2003 |
| JP | 2006-245494 | 9/2006 |
| JP | 2007-104264 | 4/2007 |
| WO | WO-01/78139 A1 | 10/2001 |

OTHER PUBLICATIONS

English machine translation of JP H09-055398 (The original Japanese document has been submitted on Mar. 4, 2011).

* cited by examiner

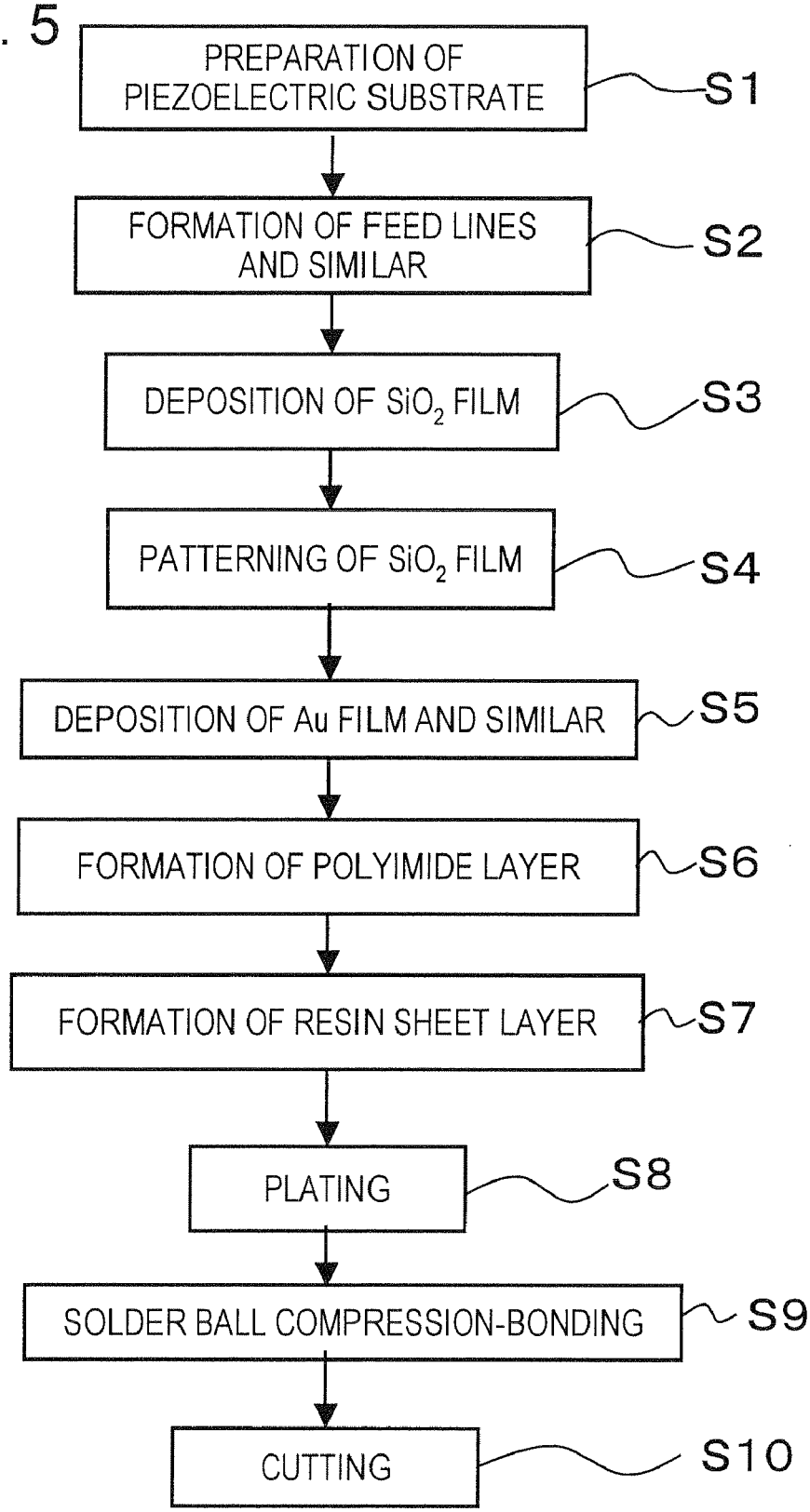

ELECTRONIC COMPONENT AND METHOD OF MANUFACTURING THE SAME

CROSS-REFERENCE TO RELATED APPLICATIONS

This application is a divisional of pending application Ser. No. 12/388,215, filed Feb. 18, 2009, which claims the benefit of priority of the prior Japanese Patent Application No. 2008-44818, filed on Feb. 26, 2008, the entire contents of which are incorporated herein by reference.

BACKGROUND OF THE INVENTION

1. Field of the Invention

This invention relates to an electronic component, terminals of which are formed thickly by electroplating, and to a method of manufacturing such electronic components.

2. Description of the Related Art

In recent years, there have been rapid advances in the miniaturization of portable telephones, transceivers, digital cameras, and other portable equipment. In response to such miniaturization of portable equipment, there have been strong demands for miniaturization of various electronic components which are the constituent components of such equipment (for example, surface acoustic wave (SAW) devices and other piezoelectric devices, integrated circuit (IC) devices, quartz oscillators, drivers, and similar).

WLCSPs (wafer-level chip-size packages) have been developed as technology to satisfy such demands. WLCSP is the latest packing technology for sealing SAW devices and ICs as they exist in the wafer state.

In WLCSP technology, numerous regions intended for chips, in which are provided one or a plurality of functional elements (for example SAW devices), are provided on a wafer, and terminals and wiring are further formed in each of these regions. Next, these regions are sealed as-is with resin or similar in the wafer state, and finally, these regions are cut from the wafer to obtain electronic components (Japanese Patent Laid-open No. 2003-188669).

In many cases, in WLCSP processes the terminals are formed to be thick by electroplating (Japanese Patent Laid-open No. 2003-188669). In order to perform electroplating, electrodes serving as an underlayer is provided, and wiring is connected to these electrodes to supply current from an external power supply.

This wiring for use in plating is unnecessary for the electronic component after separation into a chip. Hence such wiring is removed or cut after the electroplating.

From before the development of WLCSP, technology has existed for the formation by electroplating of thick metal layers on a wafer on which numerous elements are formed, followed by division into separate electronic components. For example, such technology is employed in the manufacture of semiconductor components for TAB (Tape-Automated Bonding) (Japanese Patent Laid-open No. S63-269549).

Bumps (protrusions) are formed by electroplating as bonding terminals on semiconductor components for TAB. FIGS. 1A and 1B are drawings which explains processes for bump formation in a method of manufacture of semiconductor components for TAB. FIG. 1A is a plane view explaining a state in which pads 2 for plating (an underlayer) and wires 4 are formed on the semiconductor substrate 6. On the other hand, FIG. 1B shows in enlargement the region A enclosed by the broken line in FIG. 1A.

In order to form bumps, first an insulating film (not shown) is formed on the semiconductor substrate 6.

Next, the pads 2, and wires 4 connected in common to all the pads 2 on the semiconductor substrate 6, are formed. Here, the principal portions of the wires 4 excluding leader lines 5 are provided on scribe lines.

Next, a photoresist film (not shown) which covers the wires 4 is formed.

Then, using the wires 4 as feed lines, a plating method is employed to form bumps on the pads 2, and the photoresist film is removed.

Thereafter, a dicing saw having a cutting width 8 wider than the width of the wires 4 is used to cut the wires 4 and semiconductor substrate 6 along the above scribe lines, effecting separation into individual semiconductor chips. At this time, each of the bumps connected in common by wires 4 is electrically separated.

According to the method explained referring to FIGS. 1A and 1B, the wires 4, that is, the feed lines, are removed simultaneously with cutting of the semiconductor chips by the dicing saw. Hence this method can be said to be an efficient electronic component manufacturing method which does not require a dedicated process to remove feed lines.

However, this method has the problem that, if the cutting position of the dicing saw (hereafter called the "dicer") shifts slightly, insulation between bumps, that is, between terminals, cannot be secured.

In general electronic component manufacturing methods, the cutting width 8, that is, the blade width of the dicer, is set slightly wider than the width of the wires, that is, the feed lines (for example, for a feed line width of 40 μm, the cutting width is 50 μm), in order to enable manufacture of as many electronic components as possible from a single wafer (substrate). Hence even if the cutting position of the dicer shifts only slightly from the intended cutting region, feed lines remain uncut.

FIG. 2 is a conceptual diagram explaining a state in which the cutting region 14 has shifted slightly from the intended cutting region.

In addition to the pads 2, function elements (not shown) and wires extending from the pads 2 to the function elements are also formed in the intended chip regions 12, 12', surrounded by feed lines 10. However, due to complexity of the drawing, these are omitted in FIG. 2.

In FIG. 2, intended cutting regions also are not shown. However, intended cutting regions are regions of width slightly wider than the feed lines 10, and moreover which includes the feed lines 10 in the centers thereof. That is, the intended cutting regions substantially coincide with the regions in which the feed lines 10 are provided.

In the example shown in FIG. 2, the intended cutting regions positioned on the right and left edges and above and below, and the cutting regions 14 cut by the dicer, coincide. Hence in these positions, the feed lines 10 are completely removed by the cutting of the dicer.

On the other hand, in the intended cutting region in the center, the dicer cutting region 14' is shifted slightly to the left side. As a result, an uncut portion of the feed line 10 remains on the chip separated from the intended chip region 12' positioned on the right side.

FIG. 3 is a plane view which explains the state of a chip 18 which has been separated from the intended chip region 12'.

As shown in FIG. 3, an uncut portion of a feed line 16 remains extending along the left edge of the chip 18 (in order to distinguish the uncut remaining feed line, the chip edge is shown by a broken line; similarly in other drawings as well).

Each of the plurality of bumps 20' arranged on the left side of the chip 18 is connected to the uncut remaining feed line 16 by a leader line 5. Hence the bumps 20' (arranged on the left side of the chip 18) are electrically connected to each other.

SUMMARY OF THE INVENTION

Hence an object of this invention is to provide an electronic component having terminals formed thickly by plating, in which there is no electrically connection between terminals due to uncut remaining feed lines even when the region cut by the dicer shifts from the intended cutting region, as well as a method of manufacture of such electronic components.

(First Aspect)

To achieve the above-described objects, a first aspect of the invention is characterized in that, an electronic component, including: a substrate; a functional element formed on the substrate; a plurality of terminals each including a first terminal electrode connected to the functional element, and a second terminal electrode layered on the first terminal electrode; and a feed line, one end of which is electrically connected to the first terminal electrode and the other end of which reaches an edge of the substrate, wherein the feed line includes a first portion directly reaching the edge, and a second portion branching from the first portion and then reaching the edge.

By means of this aspect, there are no uncut feed lines remaining at the edges of the substrate, so that terminals are not electrically connected by uncut remaining feed lines.

(Second Aspect)

A second aspect of the invention is characterized in that, in the first aspect, the first portion is perpendicular to the edge.

By means of this aspect, opposing first terminal electrodes can be connected over the shortest distance on the substrate prior to cutting. Hence the feed line resistance can be reduced.

(Third Aspect)

A third aspect of the invention is characterized in that, in the first aspect, the second portion proceeds parallel to the edge, and then bends.

(Fourth Aspect)

A fourth aspect of the invention is characterized in that, in the first aspect, the second terminal electrode is formed by plating.

According to the fourth aspect, there is no uncut feed line remaining along edges of the substrate, so that the yield of electronic components with terminals formed thickly by plating can be improved.

(Fifth Aspect)

A fifth aspect of the invention is characterized in that, in the first aspect, the functional element is a surface acoustic wave device having a interdigital transducer.

(Sixth Aspect)

A sixth aspect of the invention is characterized in that, in the fifth aspect, the interdigital transducer, the first terminal electrode, and the feed line are formed of the same metal layer.

(Seventh Aspect)

A seventh aspect of the invention is characterized in that, in the sixth aspect, another metal layer is deposited on the feed line.

(Eighth Aspect)

An eighth aspect of the invention is characterized in that, an electronic component, including: a substrate; a functional element formed on the substrate; a plurality of terminals each including a first terminal electrode connected to the functional element, and a second terminal electrode layered on the first terminal electrode; and a feed line, one end of which is electrically connected to the first terminal electrode and the other end of which reaches an edge of the substrate, wherein when hypothetical electronic components having the same structure are arranged on the periphery of the substrate such that a hypothetical wire that extends the feed line across the edge is connected with a hypothetical feed line of the hypothetical electronic components, a restored feed line resulting from connection of the feed line, the hypothetical wire extended portion, and the hypothetical feed line, starts from one of the first terminal electrodes, then traverses on an independent line segment a groove between the edge and the hypothetical electronic component, reaches one of hypothetical first terminal electrodes of the hypothetical electronic component, and thereafter repeatedly on an independent line segment traverses the groove and reaches one of the hypothetical first terminal electrodes or one of the first terminal electrodes, to reach from one end of the groove to the other end.

By means of this aspect, there is no uncut feed line remaining at the edges of the substrate, so that terminals are not electrically connected.

(Ninth Aspect)

A ninth aspect of the invention is characterized in that, in the eighth aspect, the feed line, after starting at the first terminal, returns on the same path and then branches.

(Tenth Aspect)

A Tenth aspect of the invention is characterized in that, a method of manufacturing an electronic component, including the steps of: forming a plurality of first terminal electrodes arranged along both sides of a first intended cutting region in which a substrate is to be cut and provided in a plurality of regions to become electronic components, and a feed line starting from one of the first terminal electrodes, then repeatedly traversing on an independent line segment either the first intended cutting region or a second intended cutting region intersecting the first intended cutting region, reaching one of the first terminal electrodes provided in the region reached by the traversal, to reach from one end of the intended cutting region to the other end; forming, on top of the first electrodes, second terminal electrodes by electroplating, by current supplied from the feed line; and cutting the substrate in the intended cutting regions.

By means of this aspect terminals are not electrically connected due to uncut remaining feed lines.

(Eleventh Aspect)

An eleventh aspect of the invention is characterized in that, in the tenth aspect, a dicing line is formed by means of a metal layer in the center of the region intended for cutting in the process to form the feed lines, and the substrate is cut with the dicing line as a marker in the process to cut the substrate.

By means of this aspect, in the process to cut the substrate, identification of the region for cutting (the intended cutting region) is made easy, so that electronic component productivity is improved.

(Twelfth Aspect)

A twelfth aspect of the invention is characterized in that, in the eleventh aspect, the dicing line is formed along a plurality of the regions without breaks.

By means of this aspect, in the process of cutting the substrate, substrate chipping can be prevented.

(Thirteen Aspect)

A thirteen aspect of the invention is characterized in that, in the eleventh aspect, a plurality of protrusions are formed along a side face of the dicing line.

By means of this aspect, in the process of cutting the substrate, identification of the dicing lines is made easy.

(Fourteenth Aspect)

A fourteen aspect of the invention is characterized in that, in the tenth aspect, the feed line includes a first portion, connecting a pair of the first terminal electrodes arranged in direct opposition with the first intended cutting region interposed therebetween and traversing the first intended cutting region, and a second portion, branching from the first portion, connecting a pair of the first terminal electrodes arranged diagonally with the first intended cutting region interposed therebetween, and traversing the first intended cutting region.

(Fifteenth Aspect)

A fifteen aspect of h invention is characterized in that, in the fourteenth aspect, the first portion is a straight line.

By means of this aspect, opposing first terminal electrodes can be connected over the shortest distance, so that feed lines are shortened, and the resistance values thereof are decreased.

(Sixteenth Aspect)

A sixteenth aspect of the invention is characterized in that, in the fourteenth aspect, the second portion has a crank shape.

By means of an electronic component or a method of manufacture of an electronic component of this invention, feed lines 10 are formed not on the inside of intended cutting regions, but so as to traverse intended cutting regions. Hence even if the region cut by the dicer is shifted from the intended cutting region, there is no electrical connection between terminal electrodes due to an uncut feed line remaining along an edge of the substrate.

That is, by means of an electronic component or a method of manufacture of electronic components of this aspect, even when the substrate cutting position is shifted, there is no electrical connection between electrical component terminals due to a remaining uncut feed line.

BRIEF DESCRIPTION OF DRAWINGS

FIG. 5 is a flow diagram showing the manufacturing procedure for the surface acoustic wave device according to the first embodiment;

DESCRIPTION OF THE PREFERRED EMBODIMENTS

Embodiments of the present invention will now be described. The protective scope of the present invention covers the inventions defined in the claims and their equivalents, but is not limited to the above embodiments.

(First Embodiment)

This embodiment relates to a surface acoustic wave device having feed lines which branch and one end of which reach the edge of the substrate, and a method of manufacture of such a component.

Figure 4:
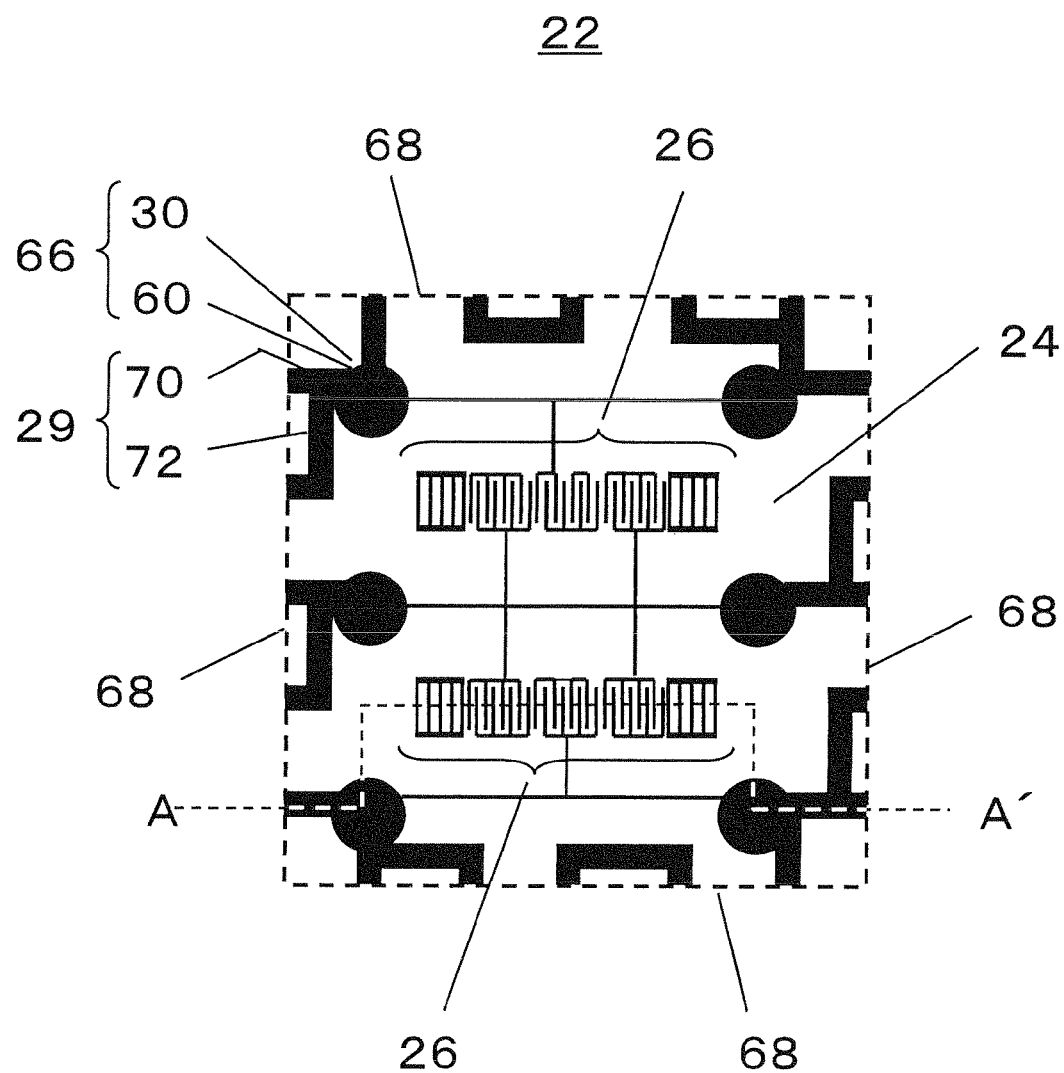
FIG. 4 is a plane view, seen through a resin layer covering the main surface of the piezoelectric substrate, of a surface acoustic wave device according to the first embodiment.

FIG. 4 is a plane view, seen through a resin layer covering the main surface of the piezoelectric substrate 24, of a surface acoustic wave device 22 of this embodiment. As shown in FIG. 4, in the surface acoustic wave device 22 of this embodiment, filters, reflectors, and other surface acoustic wave elements 26 are integrated. Also, the surface acoustic wave device 22 of this embodiment is packaged using WLCSP.

Below, the configuration of the surface acoustic wave device 22 of this embodiment is explained, with a description of the manufacturing procedure.

(1) Manufacturing Procedure

FIG. 5 is a flow diagram showing the manufacturing procedure for the surface acoustic wave device 22 of this embodiment. FIG. 6 to FIG. 10 are process cross-sectional diagrams which explain the manufacturing procedure for the surface acoustic wave device 22 of this embodiment, based on cross-sections along line A-A' in FIG. 4.

(Step S1)

Figure 6A:
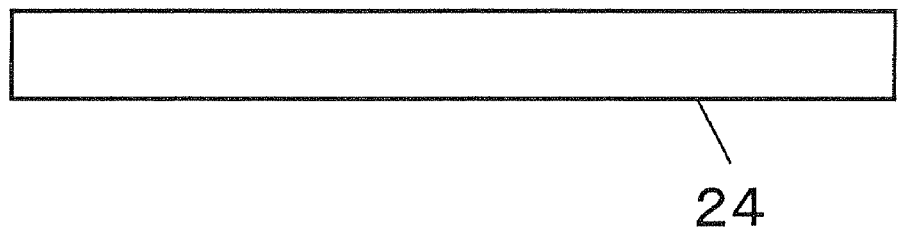
FIG. 6 is a first process cross-sectional diagram which explains the manufacturing procedure for the surface acoustic wave device according to the first embodiment.

First, as shown in FIG. 6A, an $LiTaO_3$ piezoelectric substrate 24 is prepared.

(Step S2)

Figure 6B:
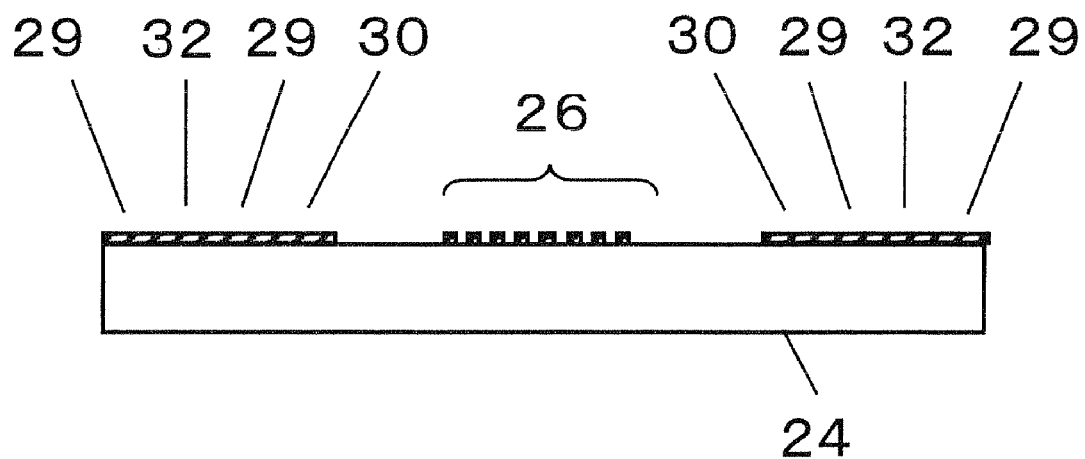

Next, as shown in FIG. 6B, aluminum or an aluminum alloy is used to simultaneously form, on the piezoelectric substrate 24, an interdigital transducer (hereafter "IDT") 26, first terminal electrodes 30 connected to the IDT 26, feed lines 29 of width 40 μm, and dicing lines 32 of width 10 μm, The thickness of the aluminum or aluminum alloy is for example from 100 nm to 400 nm.

In order to form the IDT 26, first terminal electrodes 30, and feed lines 29, first an Al or Al alloy film is formed on the piezoelectric substrate 24, by magnetron sputtering or other means. Then, a photolithography technique is used to pattern the IDT 26, first terminal electrodes 30, and feed lines 29.

Figure 11:
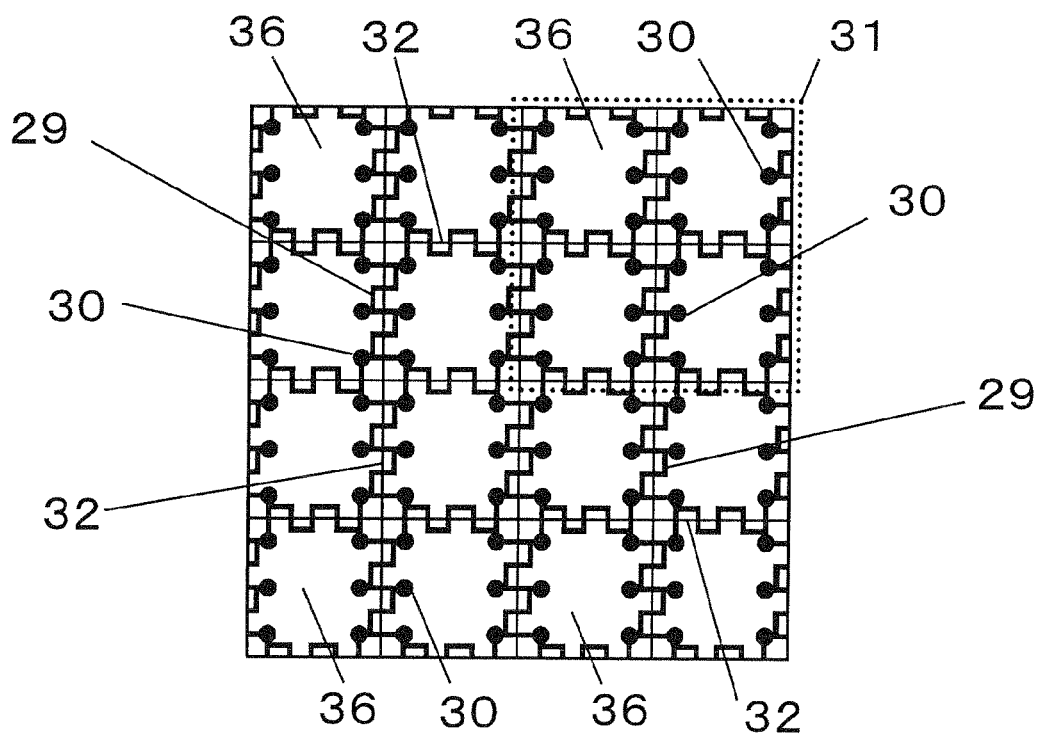
FIG. 11 is a plane view which explains the state in which the feed lines and similar have been formed on the piezoelectric substrate according to the first embodiment.
Figure 12:
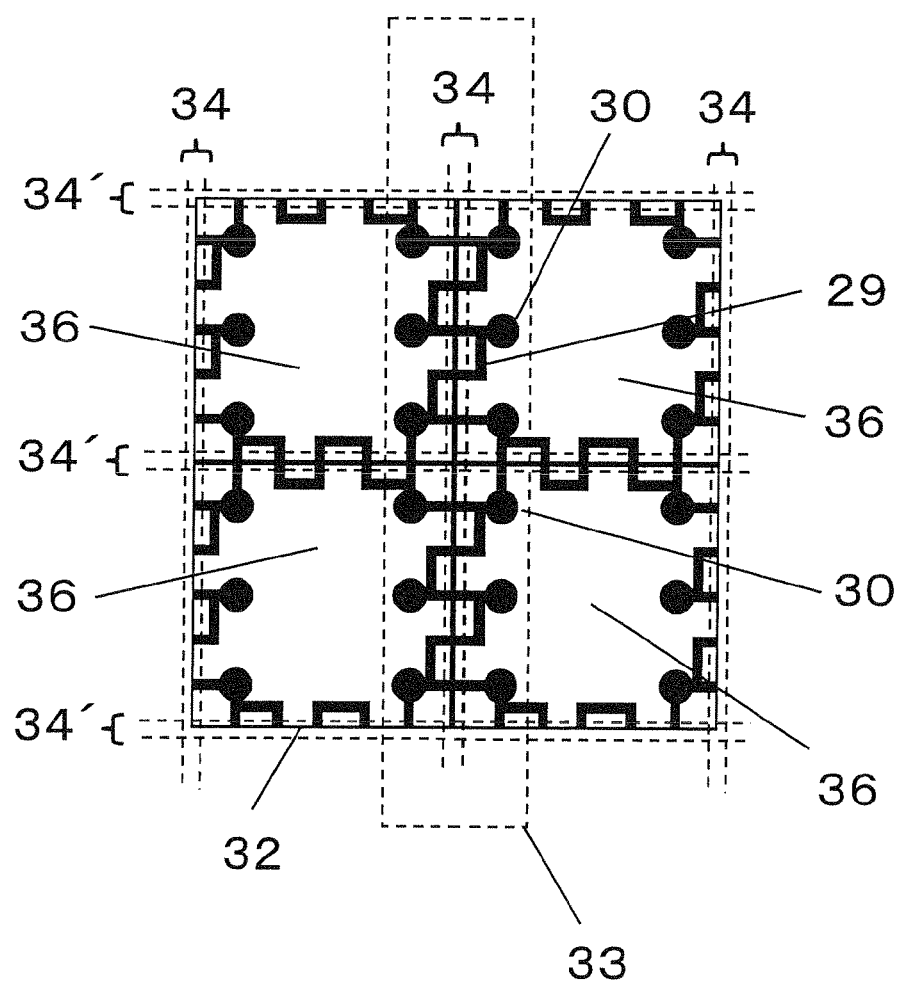
FIG. 12 is an enlarged view of the portion surrounded by the broken line in FIG. 11.
Figure 13:
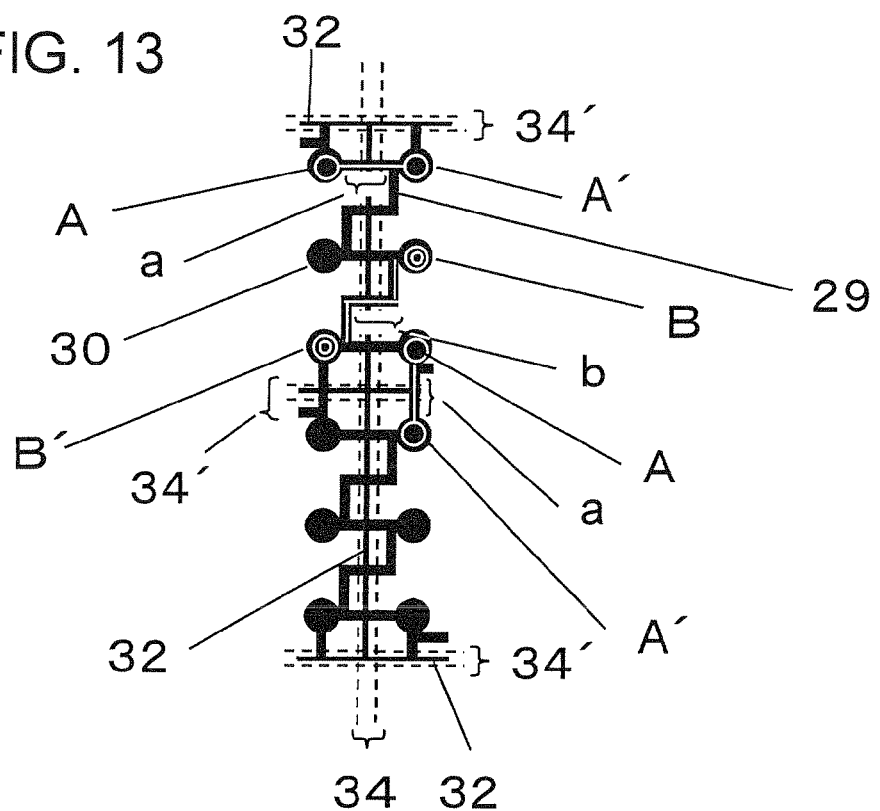
FIG. 13 is a first enlarged view of the portion surrounded by the broken line in FIG. 12.

FIG. 11 is a plane view which explains the state in which the feed lines 29 and similar have been formed on the piezoelectric substrate 24. FIG. 12 is an enlarged view of the portion 31 surrounded by the broken line in FIG. 11. FIG. 13 is a further enlarged view of the portion 33 surrounded by the broken line in FIG. 12.

Below, the structure of electrodes and wires formed in this step is explained in detail, referring to FIG. 11 to FIG. 13.

As shown in FIG. 11 and FIG. 12 (and in particular FIG. 12), in this step the IDT 26 (see FIG. 4) and the plurality of first terminal electrodes 30 are formed in the plurality of regions 36 arranged along both sides of the intended cutting regions 34, 34' of width 50 μm, where the piezoelectric substrate 24 is to be cut.

That is, in this step the plurality of first terminal electrodes 30, provided in the plurality of regions 36 where electronic components (surface acoustic wave devices) are formed, arranged on both sides of the intended cutting regions 34 in which the substrate (piezoelectric substrate 24) is to be cut, are formed.

And, as shown in FIG. 11 and FIG. 13 (and in particular FIG. 13), in this step feed lines 29 are formed, starting from one first terminal electrode 30 (for example, terminal A), then traversing the first intended cutting region 34 or the second intended cutting regions 34 with an independent line segment (for example, line segment a), and then reaching another first terminal electrode 30 (for example, terminal A') provided in the region reached by the traversal, and repeating this pattern to form a feed line 29 extending from one end of the first intended cutting region 34 (for example, the upper end) to the other end (for example, the lower end). Here, the second intended cutting region intersects the first intended cutting region.

Other examples of "one first terminal electrode 30", "independent line segment", and "another first terminal electrode 30" are terminal B, line segment b, and terminal B'.

In FIG. 13, the terminals A, A', the terminals B, B', and the line segments a, b are represented by white circles, white double circles, and white lines, respectively. The width of the feed lines 29 is for example 40 pm.

Figure 14:
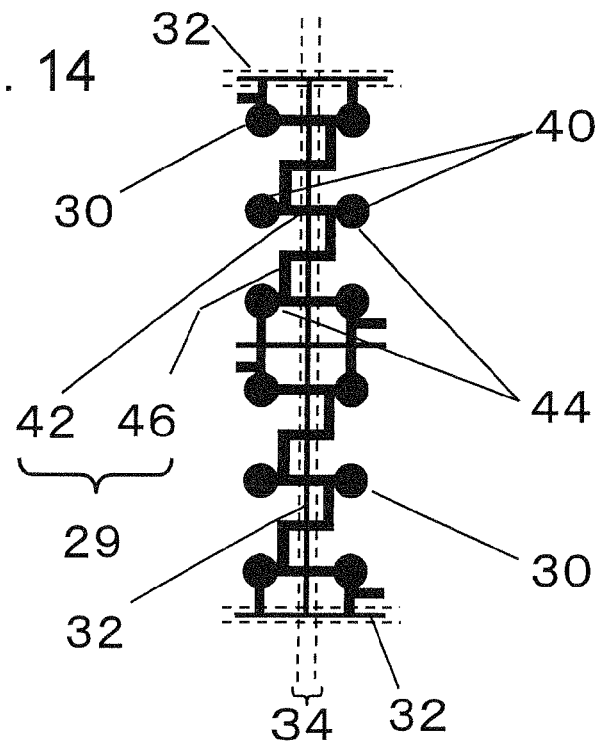
FIG. 14 is a second enlarged view of the portion surrounded by the broken line in FIG. 12.

To explain in further detail, as shown in FIG. 11 and FIG. 14 (and in particular FIG. 14), the feed line 29 formed in this step has a first portion 42, which traverses the first intended cutting region 34 to connect a pair of First terminal electrodes 40 which are arranged in direct opposition on either side of the intended cutting region 34. Further, the feed line 29 has a second portion 46, branching from the first portion 42, traversing the intended cutting region 34 to connect a pair of first terminal electrodes 44 arranged diagonally on either side of the intended cutting region 34.

To explain in further detail, in the feed line 29 formed in this step, the first portion 42 of the feed line 29 is a straight line, as shown in FIG. 14. On the other hand, the second portion 46 of the feed line 29 has the shape of a crank.

The first portion 42 of the feed line 29 is a straight line, and so the opposing first terminal electrodes can be connected over the shortest distance. Hence the feed line resistance is reduced, and uneven plating spots are decreased.

In this step, as explained above, dicing lines 32 of width 10 μm are formed as a metal layer in the center of the intended cutting regions 34, of width 50 μm (see FIG. 12 and FIG. 13). To explain in further detail, in this embodiment, dicing lines 32 are formed along a plurality of regions 36 (where electronic components are formed), without breaks.

These dicing lines 32 indicate positions for cutting by the dicer in the process of cutting the piezoelectric substrate 24 described below. However, formation of dicing lines 32 is not indispensable, and can be omitted.

(Step S3)

Figure 6C:
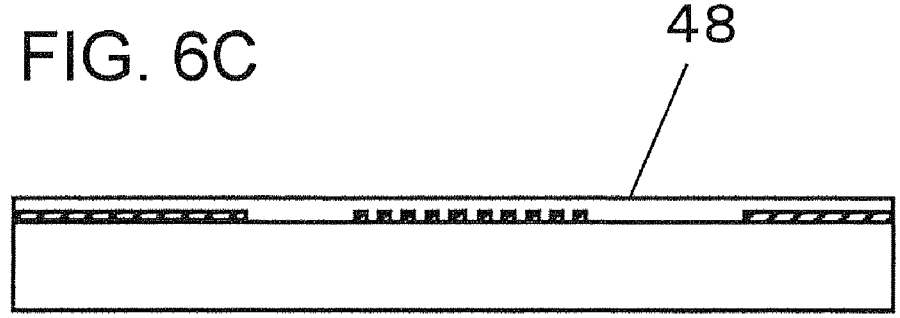

Next, sputtering is used to deposit an $SiO_2$ film 48 on the piezoelectric substrate 24 on which the IDT 26 and similar have been formed (see FIG. 6C).

(Step S4)

Figure 7A:
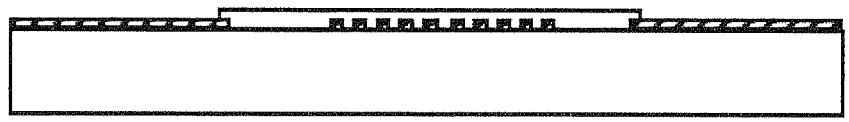
FIG. 7 is a second process cross-sectional diagram which explains the manufacturing procedure for the surface acoustic wave-device according to the first embodiment.

Next, a photolithography method and etching are used to remove the $SiO_2$ film deposited on the feed lines 29 and first terminal electrodes 30 (FIG. 7A).

(Step S5)

Next, the lift-off method and evaporation deposition method are used to form a Ti Film 50 of thickness 200 nm and an Au film 52 of thickness 150 nm on the feed lines 29 and first terminal electrodes 30 which were exposed in step S4.

Figure 7B:
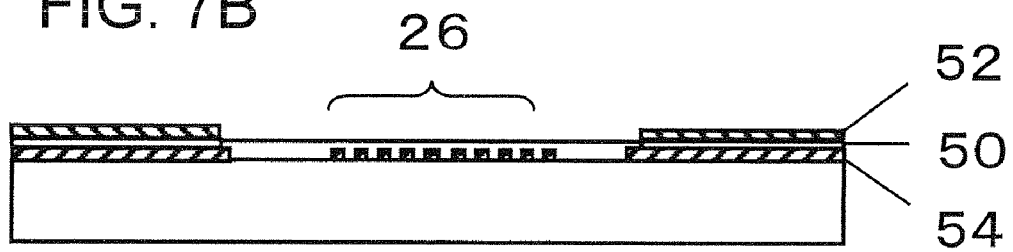

By interposing a Ti film 50 between the Au film 52 and the Al film 54, the Au film 52 adheres well to the underlayer, that is, the Al film 54 (or Al alloy (film) (FIG. 7B). By depositing a low-resistance Au film, the resistance value of feed lines which integrally combine Au film 52 and Ti film 50 is made small.

(Step S6)

Next, a photosensitive epoxy resin or polyimide resin is applied onto the piezoelectric substrate 24, on which Ti film 50 and Au film 52 have been layered on the feed lines 29, and then heating and curing are performed.

Next, the cured epoxy layer or polyimide layer 56 is irradiated with ultraviolet rays in regions other than the regions of the IDTs 26, first terminal electrodes 30, and intended cutting regions 34.

Figure 7C:
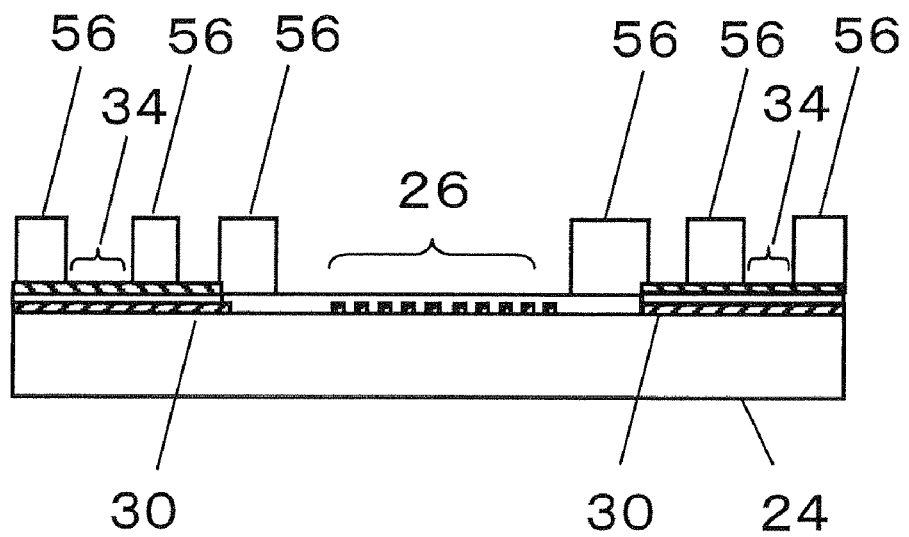

Then, the epoxy layer or polyimide layer 56 is developed, and the epoxy layer or polyimide layer 56 formed on the IDTs 26, first terminal electrodes 30, and intended cutting regions 34 is removed (see FIG. 7C).

(Step S7)

Next, a first photosensitive resin sheet 58 is applied onto the epoxy layer or polyimide layer 56 in which the IDTs 28, first terminal electrodes 30, and intended cutting regions 34 are exposed.

Next, the first photosensitive resin sheet 58 is irradiated with ultraviolet rays in regions other than the regions of first terminal electrodes 30 and intended cutting regions 34.

Then, the photosensitive resin sheet 58 is developed, and the first photosensitive resin sheet 58 on the first terminal electrodes 30 and intended cutting regions 34 is removed.

Figure 8A:
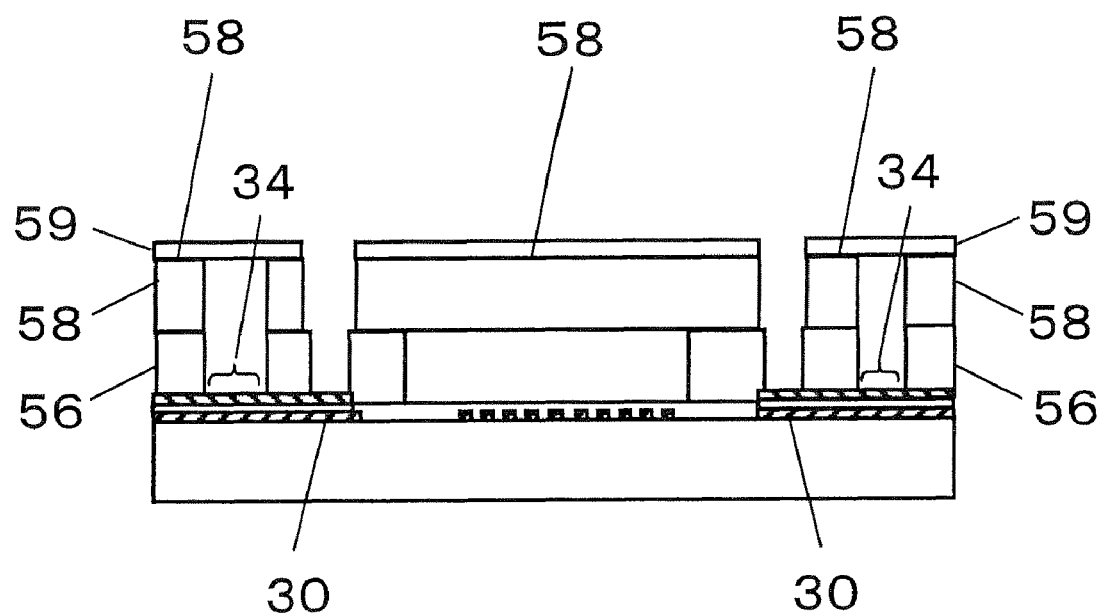
FIG. 8 is a third process cross-sectional diagram which explains the manufacturing procedure for the surface acoustic wave device according to the first embodiment.

And, a second resin sheet 59 is applied onto the first resin sheet 58 in which the first terminal electrodes 30 and intended cutting regions 34 are exposed, and then the first terminal electrodes 30 are exposed by a procedure similar to the process executed for the first resin sheet 58 (see FIG. 8A).

(Step S8)

Figure 8B:
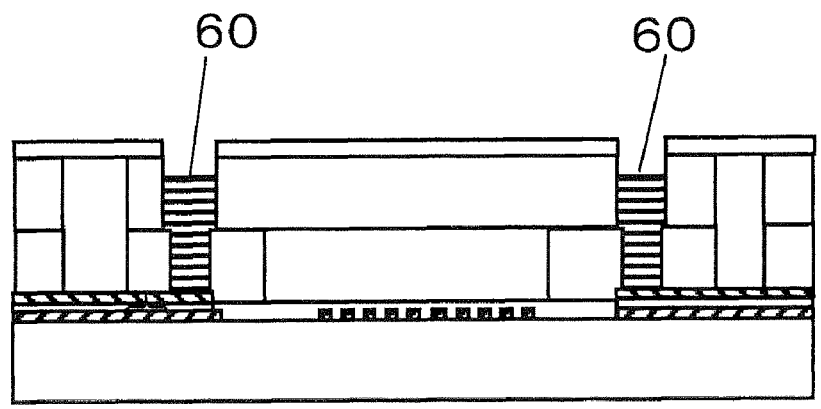

Next, by means of a current supplied from the feed lines 29, electroplating is used to form thick second terminal electrodes 60 on the first electrodes 30 (see FIG. 8B).

These second terminal electrodes 60 and the first terminal electrodes 30 are integrated to become terminals of surface acoustic wave devices 22.

(Step S9)

Figure 9A:
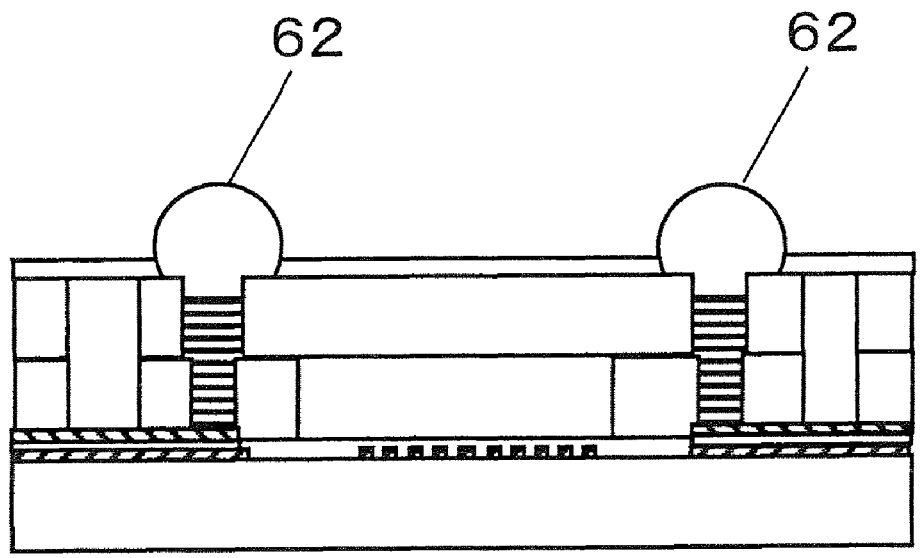
FIG. 9 is a fourth process cross-sectional diagram which explains the manufacturing procedure for the surface acoustic wave device according to the first embodiment.

Next, solder balls 62 are mounted on the second terminal electrodes 60 (see FIG. 9A).

(Step S10)

Figure 9B:
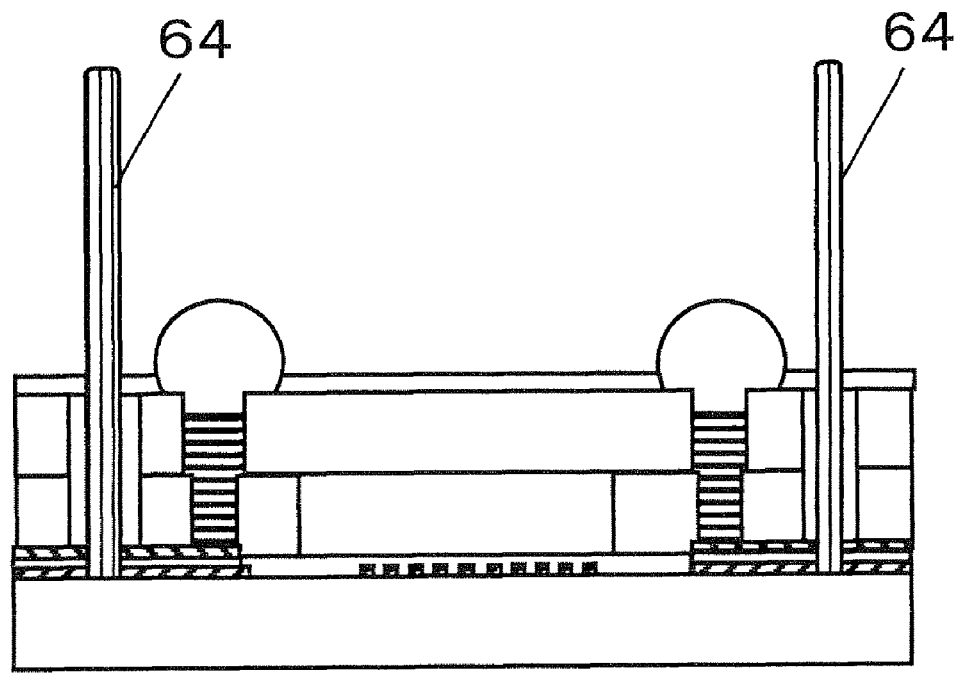

Next, using the dicing lines 32 as markers, a dicer 64 is used to cut the piezoelectric substrate 24 in the intended cutting regions 34 (see FIG. 9B).

Figure 10:
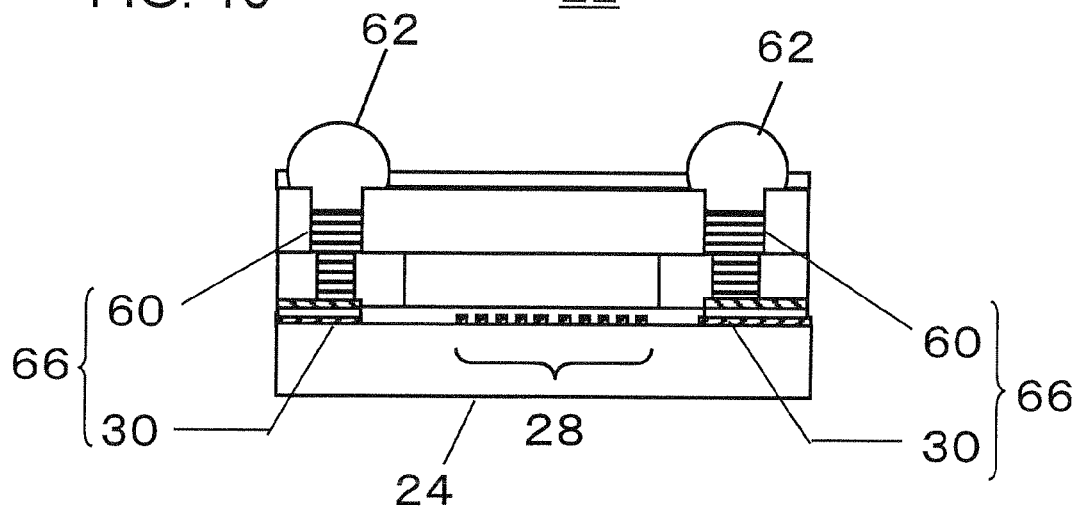
FIG. 10 is a fifth process cross-sectional diagram which explains the manufacturing procedure for the surface acoustic wave device according to the first embodiment.

Through the above processes, surface acoustic wave devices 22 having a cross-sectional structure such as that shown in FIG. 10 and a planar structure such as that shown in FIG. 4 are completed.

Then, a surface acoustic wave device 22 is arranged on a surface-mount board, on which are provided electrodes in positions corresponding to the solder balls 62, such that the electrodes of the surface-mount board and the solder 62 coincide. Next, reflow processing is used to connect the solder 62 and the electrodes, so that the surface acoustic wave device 22 is mounted on the surface-mount board.

The mounted surface acoustic wave device 22 exchanges electrical signals with the mounting board, that is, performs communication, with the terminals 66 used as signal input/output ports.

(Principle)

Figure 1A:
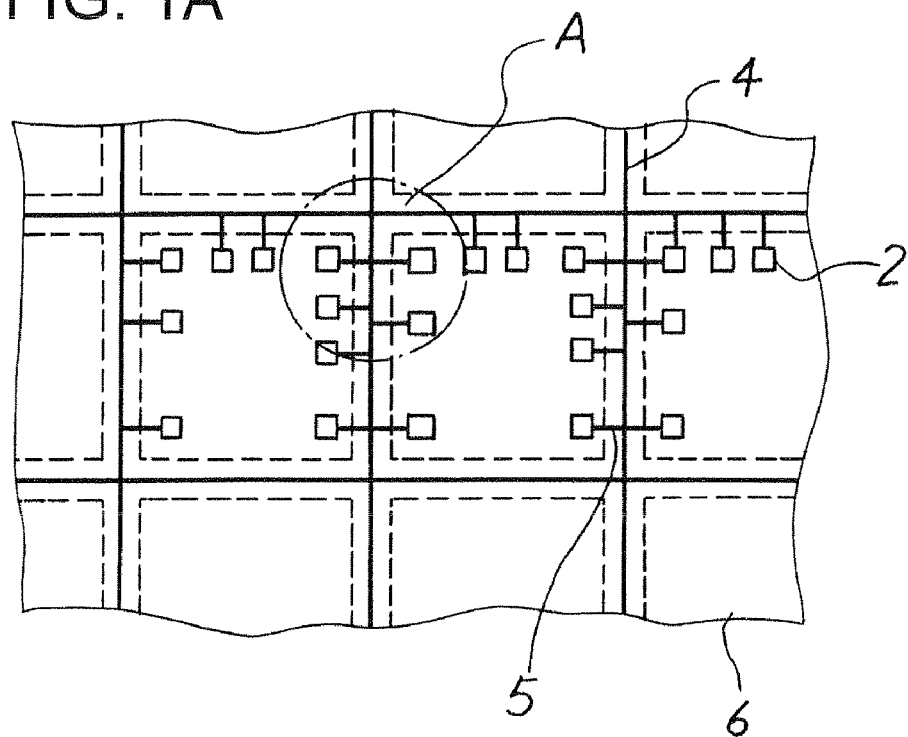
FIGS. 1A and 1B are drawings which explains processes for bump formation in a method of manufacture of semiconductor components for TAB.
Figure 1B:
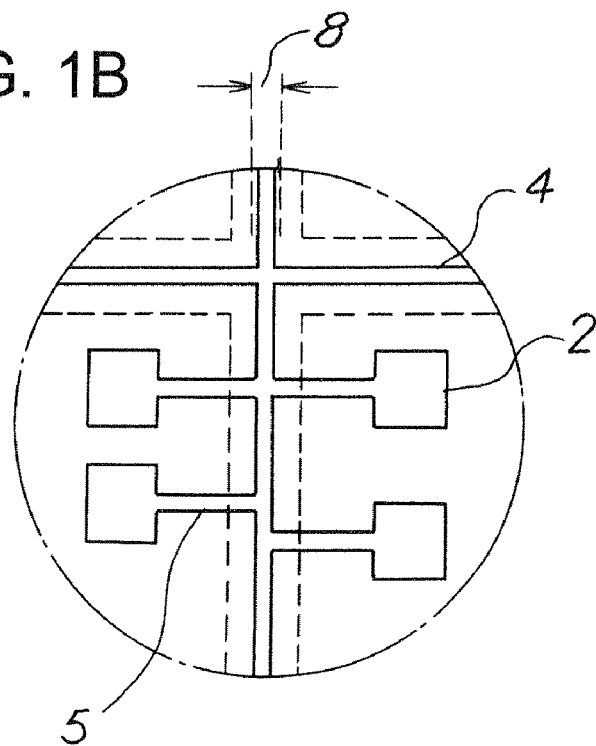
Figure 2:
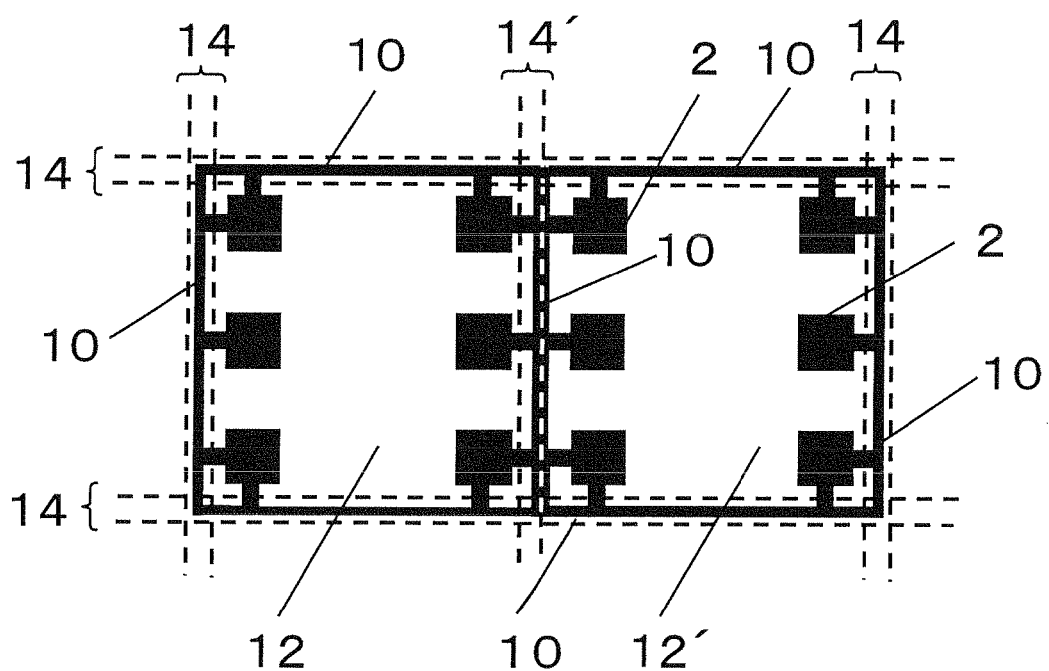
FIG. 2 is a conceptual diagram explaining a state in which the cutting region has shifted slightly from the intended cutting region according to the related invention.
Figure 3:
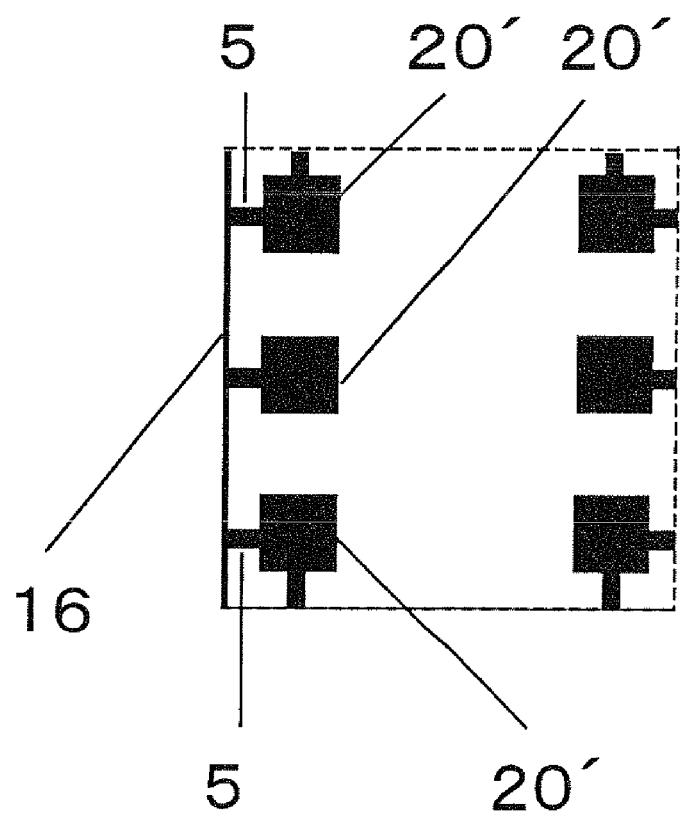
FIG. 3 is a plane view which explains the state of a chip which has been separated from the intended chip region.
Figure 15:
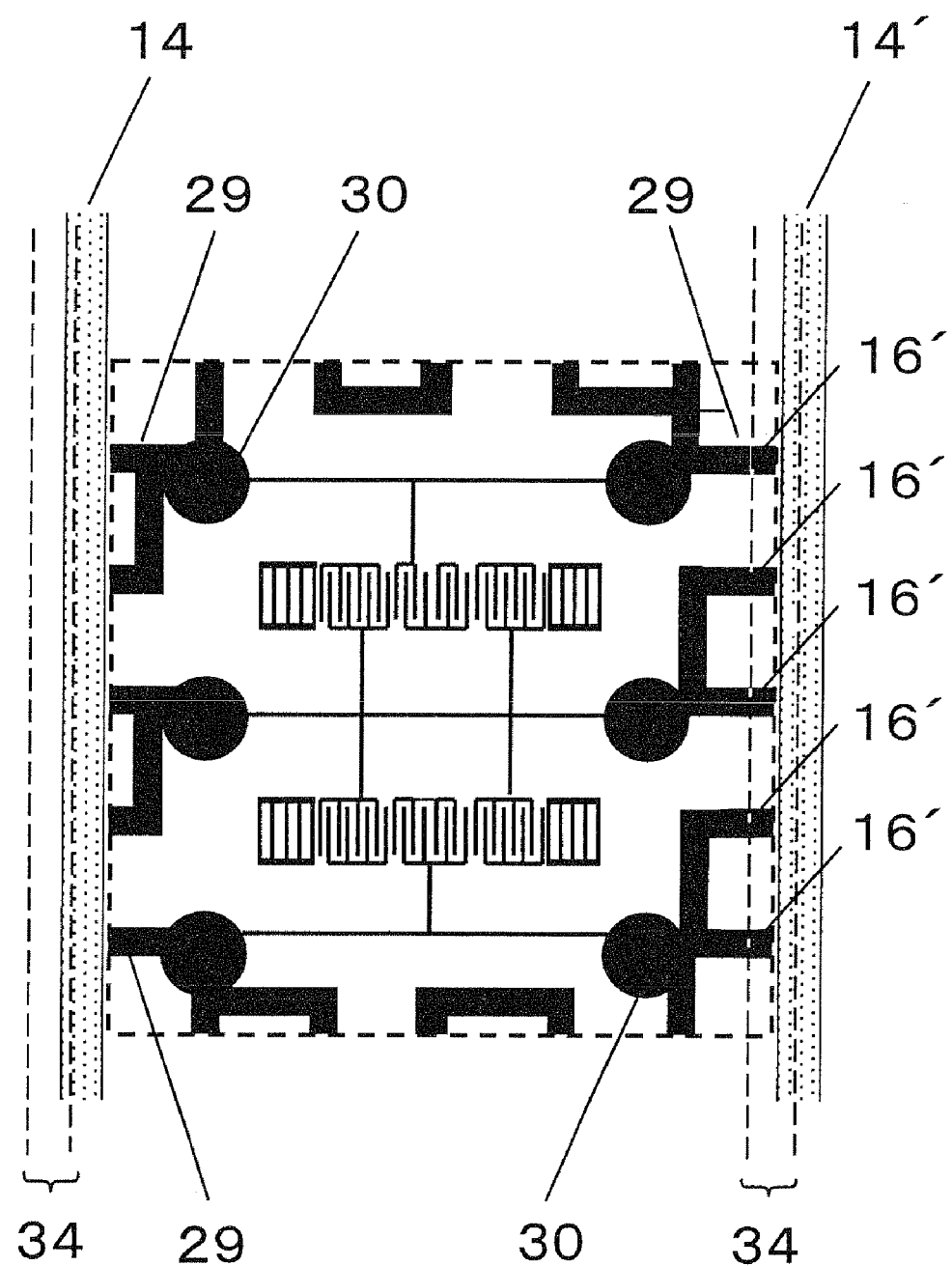
FIG. 15 is a plane view, seen through a resin layer, of the piezoelectric substrate after cutting.

FIG. 15 is a plane view of a piezoelectric substrate after cutting. The right-hand cutting region 14' is shifted from the intended cutting region 34 to the right-hand side. The feed lines 29 formed according to this embodiment differ from the feed lines 10 of the related technology shown in FIG. 2, in being formed so as to traverse the intended cutting regions 34, rather than remaining inside the intended cutting regions 34, 34' (see FIG. 13). Hence even if the regions 14, 14' cut by the dicer are shifted from the intended cutting regions 34, 34', there is no connection together of first terminal electrodes 30 by uncut remaining feed lines 29, as shown in FIG. 15.

That is, by means of the method of manufacture of electronic components of this embodiment, even when the substrate cutting positions (cutting regions) are shifted, there are no electrical connections of terminals due to uncut remaining feed lines.

FIG. 15 is a plane view of the state of the piezoelectric substrate after cutting, seen through the resin layers (epoxy film or polyimide film 56, first and second photosensitive resin sheets 58 and 59).

In this embodiment, as shown in FIG. 12 and elsewhere, dicing lines 32 run through the centers of the intended cutting regions 34, 34'. However, the dicing lines 32 do not serve as feed lines, and so can be made substantially narrower than the intended cutting regions 34, 34'.

For example, in this embodiment the width of the intended cutting regions 34, 34' (the dicer blade width) is 50 μm, while on the other hand the width of the dicing lines 32 is 10 μm. Hence even if the cutting regions 14 are shifted somewhat from the intended cutting regions 34, 34', there are no uncut dicing lines 32 remaining.

It should be added that the width of the feed lines 29 in this embodiment is 40 μm, but this width cannot easily be decreased.

If the feed lines 29 are too narrow, the resistance value rises. If plating is performed using such feed lines, uneven plating spots tend to occur. As a result, the thickness of the second terminal electrodes 60 formed by plating is not constant. The occurrence of such uneven plating spots should be avoided, and so there is a limit to the extent to which the width of the feed lines 29 can be reduced in order to eliminate uncut remaining feed lines 29.

If the width of the feed lines 29 is reduced, the resistance value can be decreased by forming the feed lines 29 more thickly. However, in this embodiment the feed lines 29 are formed simultaneously with the IDTs 28, so that thick formation of feed lines 29 is difficult.

This is because the higher the operating frequency of the surface acoustic wave elements, the thinner the IDTs 28 must be made. For example, in current surface acoustic wave elements the center frequency of which is made high, even feed lines 29 of width 40 μm are thin enough that uneven plating spots can occur.

Hence in this embodiment, other metal films (a Ti film 50 and Au film 52) are also formed on the feed lines 29, to lower the resistance (see step S5).

However, in this embodiment, the feed lines 29 are formed so as to traverse intended cutting regions, so that there is no need to make the width of the feed lines 29 smaller than the width of the intended cutting regions. Hence the width of the feed lines 29 can for example be broadened to 80 μm, to lower the resistance value of the feed lines 29 and make less likely the occurrence of uneven plating spots.

If the feed lines 29 are formed from a low-resistance metal such as for example Au, then even when the feed lines are thin and also narrow, the resistance can be made low. However, normally feed lines are formed simultaneously with the functional element electrodes (for example, IDTs 28) to simplify manufacturing processes, as in the above-described method of manufacture of surface acoustic wave devices. Hence the material of the feed lines is limited to the same material as that used in the electrodes of functional elements (for example, Al). Hence the feed lines 29 cannot be formed using a low-resistance metal to lower the resistance.

Dicing lines 32 are not provided only to indicate positions for cutting by the dicer and facilitate cutting of the piezoelectric substrate 24. Dicing lines 32 are also effective for preventing chipping of the piezoelectric substrate 24 during cutting.

If wires laterally span the course of cutting of the piezoelectric substrate by the dicer, then when the wires are cut, the piezoelectric substrate 24 continuous with the cutting regions 14 breaks and becomes small pieces. Such chipping can destroy members formed close to the cutting regions 14, such as for example first and second terminal electrodes 30, 60.

However, in this embodiment the dicing lines 32 pass through the intended cutting regions 34, 34', so that the dicer continuously cuts the metal film. As a result, almost no chipping occurs. Hence there is no longer a need to provide buffer areas on both sides of a cutting region, in order to avoid adverse effects due to chipping. Consequently electronic components can be made smaller, and to this extent more electronic components can be manufactured from a single substrate.

(Configuration)

Finally, features of the configuration of surface acoustic wave devices 22 manufactured according to the above procedure are explained.

As shown in FIG. 4, an electronic component (surface acoustic wave device 22) manufactured according to this embodiment comprises a substrate (piezoelectric substrate 24), and functional elements (surface acoustic wave elements 26) formed on the substrate 24.

The electronic component 22 comprises a plurality of terminals 66, having first terminal electrodes 30 connected to the functional elements, and second terminal electrodes 60 layered on the first terminal electrodes 30.

Further, the electronic component 22 comprises feed lines 29, one end of which is electrically connected to a first terminal electrode 30, and the other end of which is connected to an edge 68 of the substrate 24.

And, the feed lines 29 have a first portion 70 directly reaching an edge 68, and a second portion 72, branching from the first portion 70 and then reaching the edge 68.

Here, the first portions 70 may be perpendicular to the edge 66 or may be diagonal. And, as shown in FIG. 4, the second portions 72 may proceed parallel to the edge 66 and then be bent.

An electronic component 22 having the above configuration can be manufactured by the manufacturing method described above, so that even if cutting positions of the piezoelectric substrate are shifted during manufacturing processes, there are no electrical connections between terminals 66 due to uncut remaining feed lines.

On the other hand, features of the configuration of a surface acoustic wave device 22 manufactured according to the above procedure can also be explained as follows.

Figure 16:
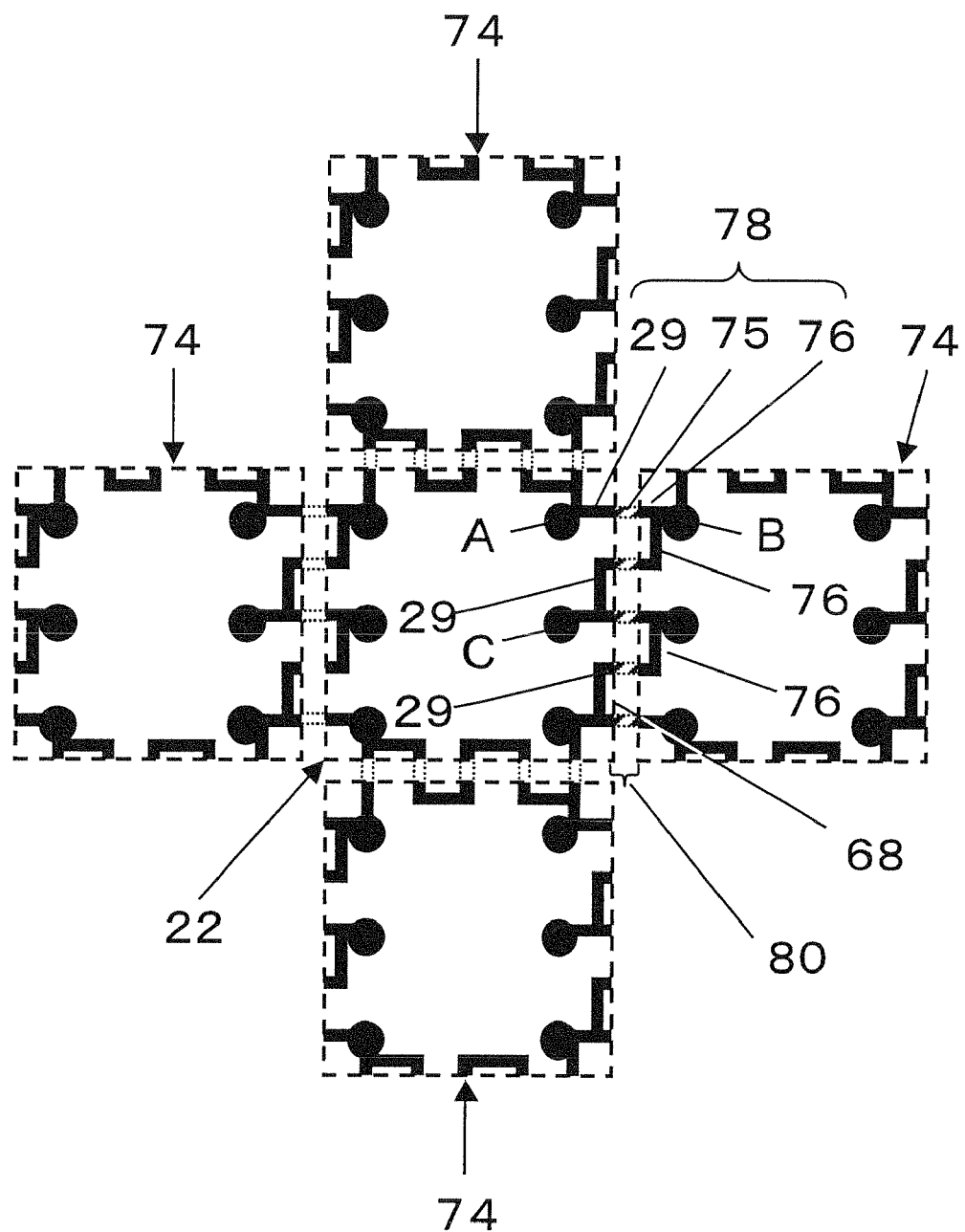
FIG. 16 is a plane view used to explain the characteristics of the configuration of a surface acoustic wave device manufactured according to the above procedure of the first embodiment.

FIG. 16 is a plane view used to explain, from a different perspective, the features of the configuration of a surface acoustic wave device 22 manufactured according to the above procedure.

The figure drawn in the middle shows a surface acoustic wave device 22 manufactured according to the above procedure. The figures drawn on the periphery of this surface acoustic wave device 22 are hypothetical surface acoustic wave devices 74 having the same structure as the surface acoustic wave device 22. In FIG. 16, the functional elements 26 are omitted so that the drawing does not become too complicated.

An electronic component (surface acoustic wave device 22) manufactured according to this embodiment has a substrate (piezoelectric substrate 24), and functional elements (surface acoustic wave elements 26) formed on the substrate, as shown in FIG. 4.

The electronic component 22 manufactured according to this embodiment has a plurality of terminals 66, having first terminal electrodes 30 connected to the functional elements, and second terminal electrodes 60 layered on the first terminal electrodes 30.

Further, the electronic component 22 manufactured according to this embodiment comprises feed lines 29, one end of which is electrically connected to a first terminal electrode 30, and the other end of which is connected to an edge 68 of the substrate.

Next, as shown in FIG. 16, for the electronic component 22, a case is supposed in which hypothetical electronic components (hypothetical surface acoustic wave devices 74) are arranged on the periphery of the substrate (that is, the electronic component 22) such that hypothetical wires 75 extending from feed lines 29 over edges 68 are connected with hypothetical feed hues 76 comprised by the hypothetical electronic components (hypothetical surface acoustic wave devices 74) having the same structure as the electronic component 22.

In this case, in the electronic component 22 manufactured according to this embodiment, a restored feed line 78, resulting by performing restoration to connect the feed line 29, the hypothetical wire extension portions 75, and the hypothetical feed lines 76, starts from one of the first terminal electrode A, and then traverses the groove 80 between the substrate edge 68 and the hypothetical electronic component (hypothetical surface acoustic wave device 74) with a line segment, to reach one of the hypothetical first terminal electrode B (a hypothetical first terminal electrode) of a hypothetical electronic component (hypothetical surface acoustic wave device 74), and traverses the groove 80 with independent line segments to reach the other first terminal electrode C, thereafter repeatedly traverses the groove and reaches one of the hypothetical first terminal electrodes or one of the first terminal electrodes, thereby starting from the side at one edge (the upper side) of the groove 80 to reach the other edge side (the lower side).

Such an electronic component is in fact an electronic component manufactured according to the above procedure (step S1 to step S10), and so even if a substrate cutting position is shifted in the manufacturing processes, there are no electrical connections between terminals 66 due to uncut remaining feed lines.

(Second Embodiment)

This embodiment relates to a method of manufacture of an electronic component in which protrusions are provided on the side faces of dicing lines.

The method of manufacture of electronic components according to this embodiment is substantially the same as the method of manufacture of the first embodiment, except for the formation of a plurality of protrusions 82 on the side faces of dicing lines.

Figure 17:
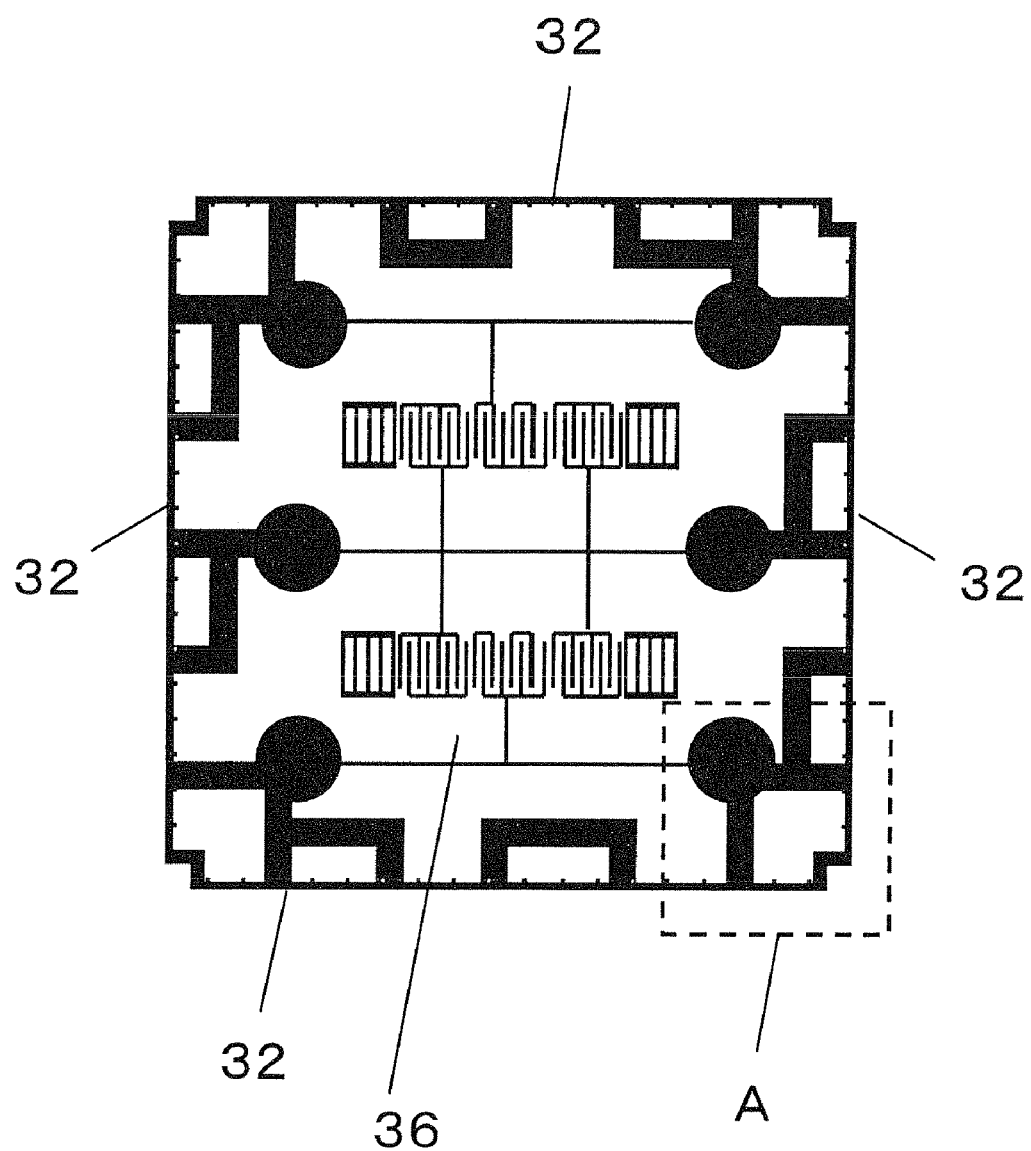
FIG. 17 is a plane view explaining dicing lines formed on the outer periphery of the region which is to become the electronic component (second embodiment)
Figure 18:
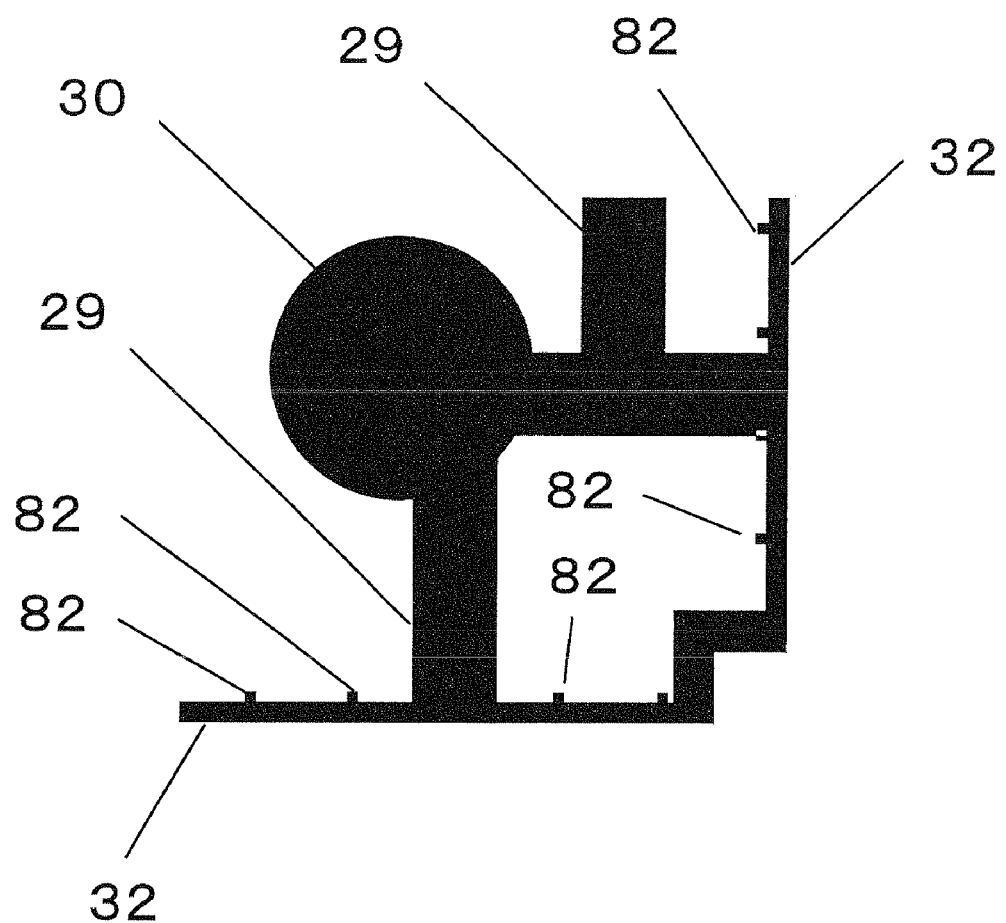
FIG. 18 is an enlarged view of the region surrounded by the broken line in FIG. 17.

FIG. 17 is a plane view explaining dicing lines 32 formed on the outer periphery of the region 36 which is to become the electronic component. FIG. 18 is an enlarged view of the region A surrounded by the broken line in FIG. 17.

In this embodiment, as shown in FIG. 18, dicing lines having protrusions onside faces are formed. Hence when cutting the substrate to cut away electronic components, dicing lines can easily be distinguished from feed lines 29, and so productivity is improved.

The dicing lines 32 of this embodiment differ from the dicing lines of the first embodiment in being formed not as straight lines, but so as to avoid points of intersection of intended cutting regions 34, 34' (see FIG. 17 and FIG. 18). This is in order to form alignment marks for ultraviolet exposure at the points of intersection of the intended cutting regions 34, 34'.

COMPARATIVE EXAMPLE

In the method of manufacture of an electronic component according to the first embodiment, as shown in FIG. 13, feed lines 29 traversing the intended cutting regions 34, 34' as independent line segments a, b are provided on the substrate on which function elements are formed.

However, feed lines which traverse the intended cutting regions 34, 34' with non-independent line segments, for example, as line segments intersecting other line segments, are also conceivable.

Figure 19:
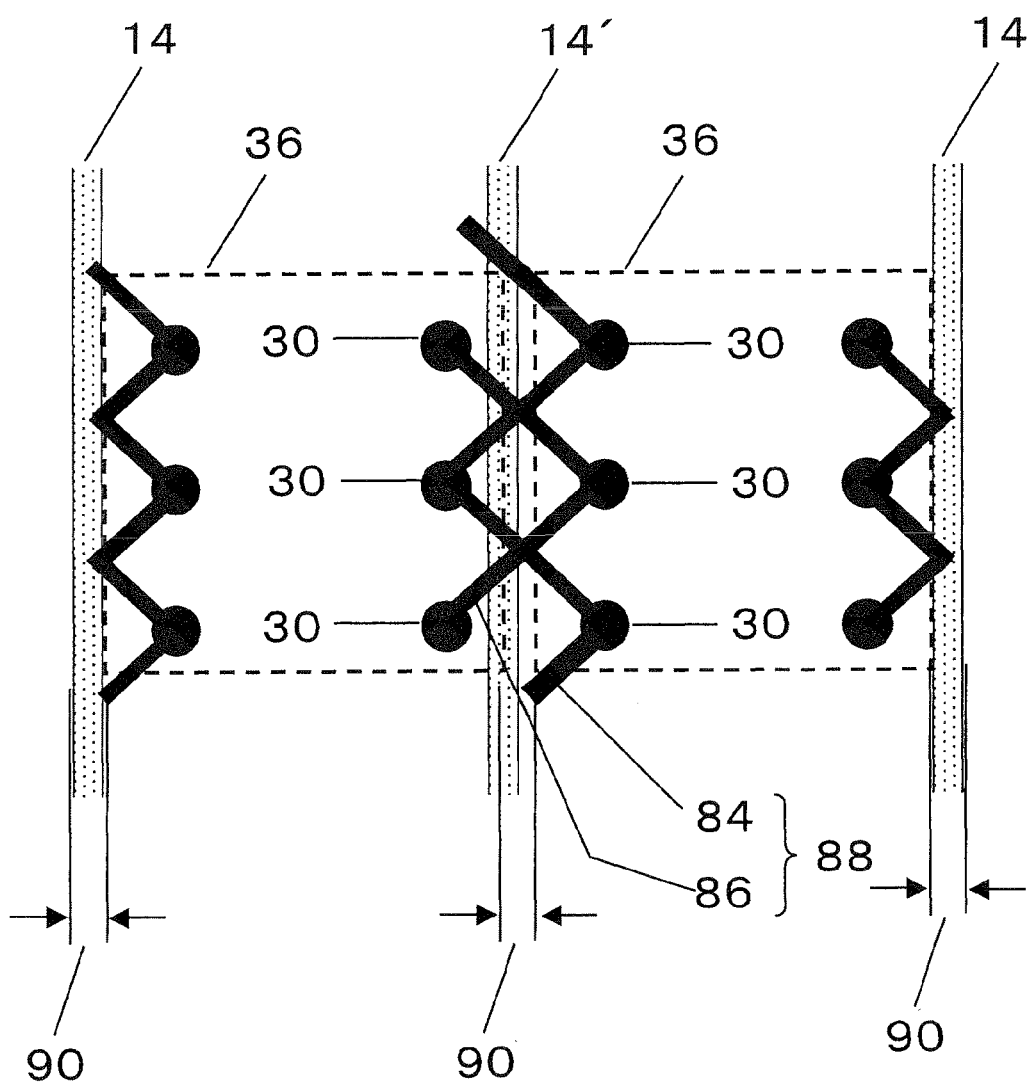
FIG. 19 explains an example of feed lines traversing the intended cutting regions with intersecting line segments.

FIG. 19 explains an example of feed lines traversing the intended cutting regions 34, 34' with intersecting line segments.

The feed lines 88 have feed trunk lines 84 connecting first terminal electrodes 30, 30' in a zigzag pattern, and feed branch lines 86 diagonally intersecting the feed trunk lines 84. The feed trunk lines 84 connect the first terminal electrodes 30, 30' in a zigzag pattern, so that half of the first terminal electrodes 30, 30' remain without being connected.

Feed branch lines 86 serve to connect first terminal electrodes 30, 30' which have not been connected. There are no examples of electronic components which use such feed lines, but there are examples of application to the manufacture of boards for electronic component mounting (Japanese Patent Laid-open No. 2006-245494).

However, when using such feed lines, even if the cutting regions 14 are shifted slightly from the original cutting positions, the feed lines 29 are not broken, and the first terminal electrodes 30, 30' remain in an electrically connected state.

Figure 20:
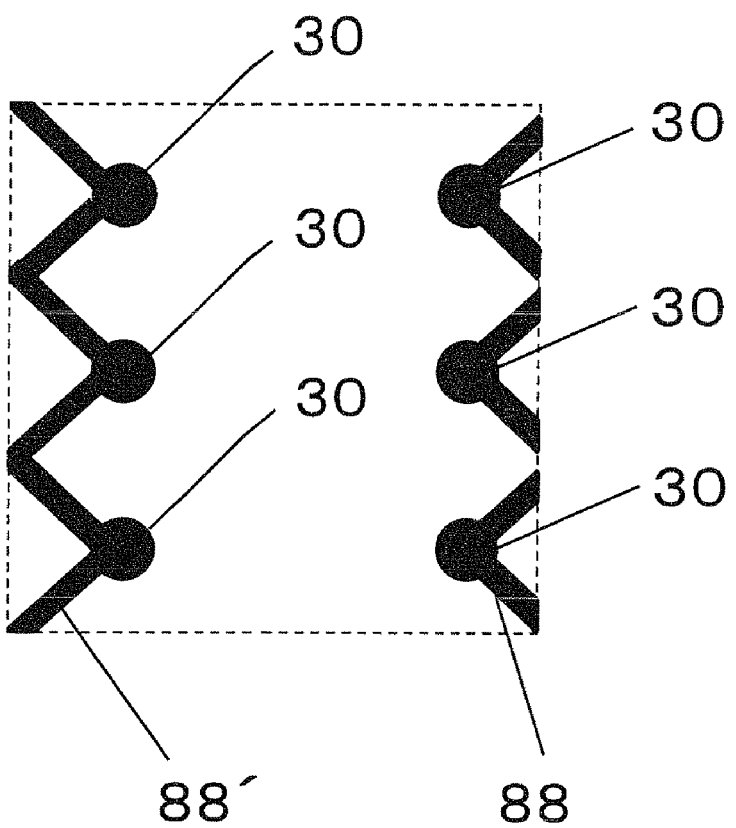
FIG. 20 explains a state of the electronic component cut away in the case where feed lines traverse the intended cutting regions with intersecting line segments.

For example, in the example shown in FIG. 19, the center cutting region 14' is shifted to the left from the original cutting position (cutting region). FIG. 20 is a plane view of the electronic component cut away in this case. As shown in FIG.

20, the feed line 88 on the right side is correctly broken. However, the feed line 88' on the left side is not broken.

For this reason, the first terminal electrodes 30 arranged on the left side remain electrically connected by the feed line 88' even after cutting.

This is because the feed lines 88 traverse the intended cutting regions 90 as intersecting line segments.

On the other hand, in the above embodiment the feed line 29 traverses the intended cutting regions 34, 34' as independent line segments, so that even if the cutting region is shifted from the original position, the feed lines are broken. Hence the first terminal electrodes 30 are not electrically connected by the feed lines.

MODIFIED EXAMPLE

Figure 21:
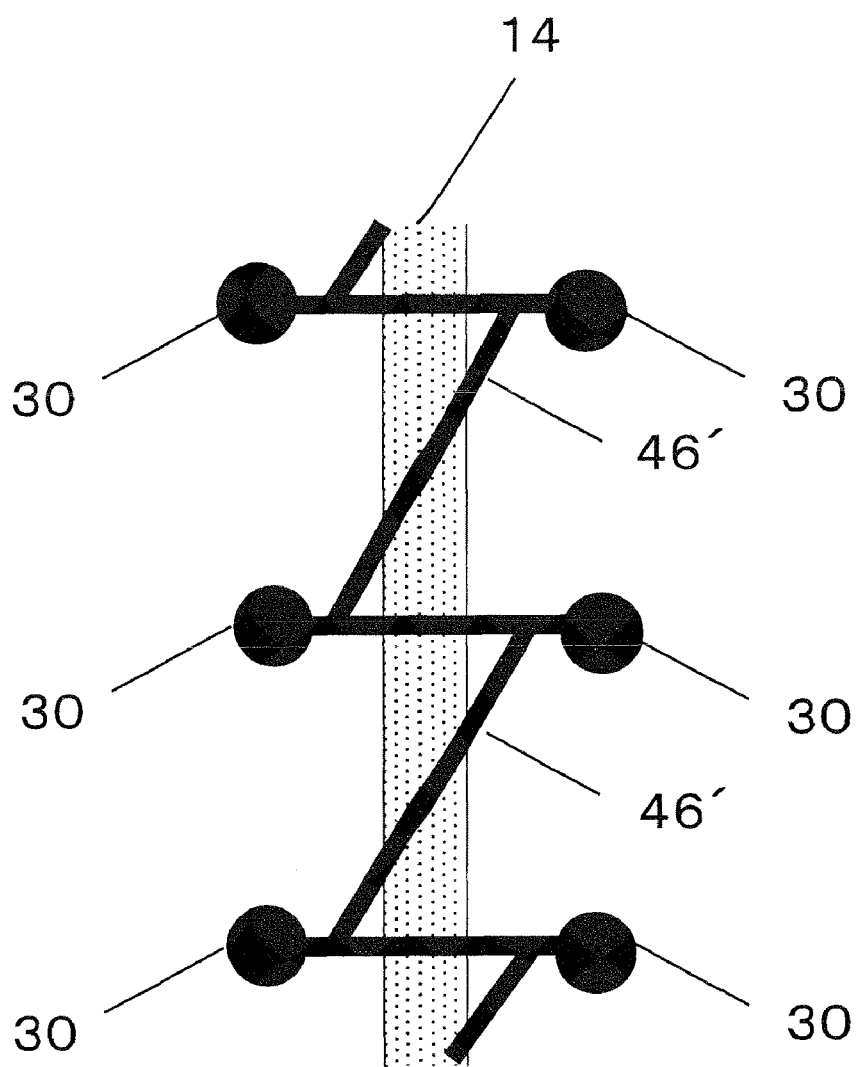
FIG. 21 shows a first modified example of the first embodiment.
Figure 22:
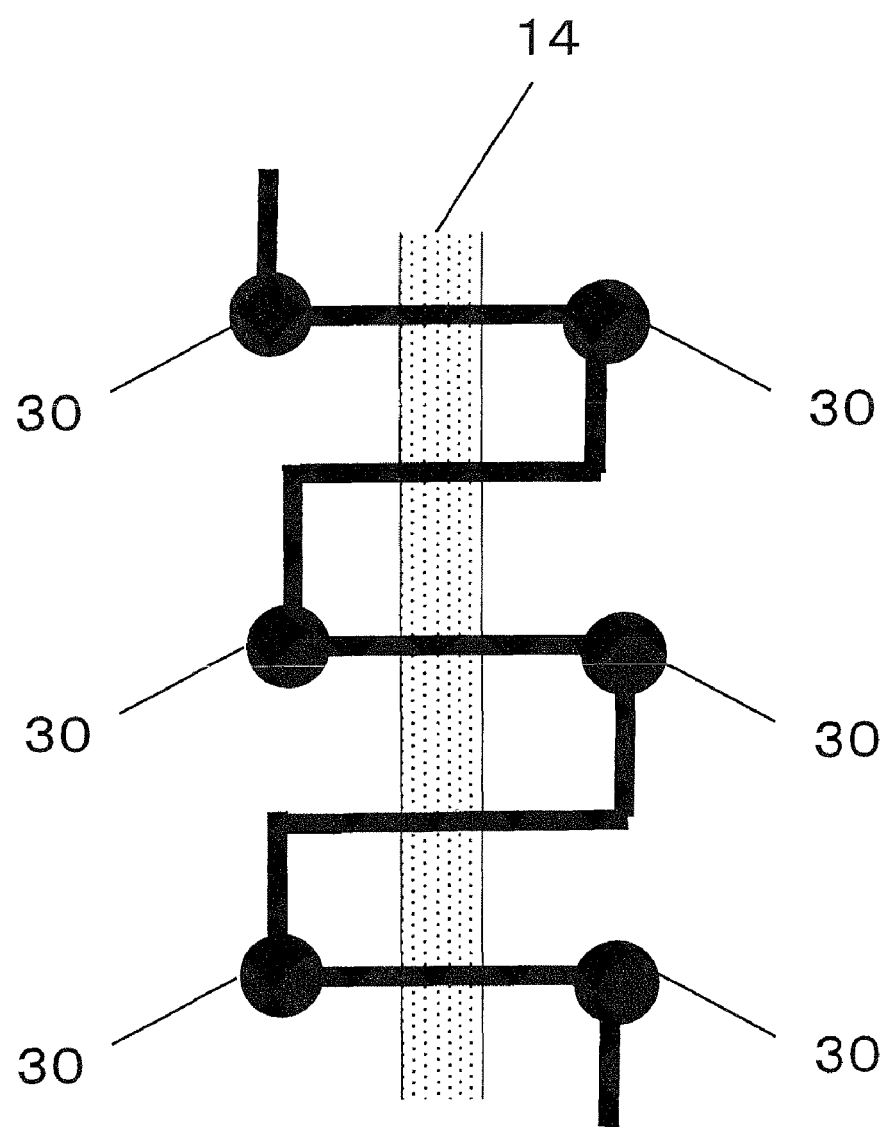
FIG. 22 shows a second modified example of the second embodiment.

FIG. 21 and FIG. 22 show a modified example of the first embodiment.

In the electronic component manufacturing method of the first embodiment, as shown in FIG. 14, feed lines 29 are formed having first portions 42 which connect in a straight line pairs of first terminal electrodes 40 arranged in direct opposition on either side of a first intended cutting region 34, and crank-shape second portions 46 which branch from first portions 42.

However, the shape of feed lines formed in this invention is not limited to such shapes, and the second portions 46' may be straight lines traversing the cutting region 14 diagonally, as in FIG. 22.

Further, in FIG. 14 the second portions 46 branch midway from the first portions 42, but may branch directly from the first terminal electrodes 30, as in FIG. 22.

Further, in the first and second embodiment, the substrate is a piezoelectric substrate, and surface acoustic wave elements are formed as functional elements. However, the substrate and function elements are not limited thereto, and for example memory or other semiconductor components may be formed on a semiconductor substrate.

What is claimed is:

1. A method of manufacturing an electronic component, comprising the steps of:

on a piezoelectric substrate, forming a plurality of first terminal electrodes, an interdigital transducer, and a feed line from a same metal at the same time, the plurality of first terminal electrodes being arranged along both sides of a first intended cutting region in which the substrate is to be cut and provided in a plurality of regions to become electronic components, the interdigital transducer being connected to at least one of the plurality of first terminal electrodes, and the feed line starting from one of the first terminal electrodes, then repeatedly traversing on an independent line segment either the first intended cutting region or a second intended cutting region intersecting the first intended cutting region, reaching one of the first terminal electrodes provided in the region reached by the traversal, to reach from one end of the intended cutting region to the other end;

forming, on top of the first electrodes, second terminal electrodes by electroplating, by current supplied from the feed line; and cutting the substrate in the intended cutting regions.

2. The method of manufacturing an electronic component according to claim 1, wherein, in the step of forming the feed line, a dicing line is formed by means of a metal layer in the center of the intended cutting regions, and, in the step of cutting the substrate, the dicing line is used as a marker to cut the substrate.

3. The method of manufacturing an electronic component according to claim 2, wherein the dicing line is formed along a plurality of the regions without breaks.

4. The method of manufacturing an electronic component according to claim 2, wherein a plurality of protrusions are formed along a side face of the dicing line.

5. The method of manufacturing an electronic component according to claim 1, wherein the feed line comprises a first portion, connecting a pair of the first terminal electrodes arranged in direct opposition with the first intended cutting region interposed therebetween and traversing the first intended cutting region, and a second portion, branching from the first portion, connecting a pair of the first terminal electrodes arranged diagonally with the first intended cutting region interposed therebetween, and traversing the first intended cutting region.

6. The method of manufacturing an electronic component according to claim 5, wherein the first portion is a straight line.

7. The method of manufacturing an electronic component according to claim 5, wherein the second portion has a crank shape.

* * * * *